United States Patent [19]

Dupraz

[11] Patent Number: 4,933,630
[45] Date of Patent: Jun. 12, 1990

[54] SYSTEM FOR MEASURING PHASE CURRENTS IN A 3-PHASE INSTALLATION

[75] Inventor: Jean-Pierre Dupraz, Lyons, France

[73] Assignee: GEC Alsthom SA, Paris, France

[21] Appl. No.: 381,431

[22] Filed: Jul. 18, 1989

[30] Foreign Application Priority Data

Jul. 26, 1988 [FR] France ................... 88 10063

[51] Int. Cl.$^5$ .................... G01R 19/00; G01R 1/20
[52] U.S. Cl. ................... 324/107; 324/117 R; 324/127
[58] Field of Search .............. 324/107, 127, 117 R, 324/126, 142; 340/870.27

[56] References Cited

U.S. PATENT DOCUMENTS 4,794,327 12/1988 Fernandes ................... 324/142
4,795,973 1/1989 Smith-Vaniz et al. ........... 324/126

FOREIGN PATENT DOCUMENTS 2656817 12/1976 Fed. Rep. of Germany .

OTHER PUBLICATIONS

Pettinga et al; "A Polyphase . . . "; IEE Proceedings; vol. 130; PT. B; No. 5; Sep. 1983, pp. 360–363.

Primary Examiner—Ernest F. Karlsen

[57] ABSTRACT

The invention relates to a system using Rogowski coils to measure the phase currents in a three-phase installation. Each coil (1, 2, 3) is connected firstly to a corresponding operational amplifier (10, 20, 30) connected as an integrator, and secondly to a corresponding inverter (100, 200, 300) whose output is connected to the inputs of the integrating amplifiers of the other two phases. With appropriately selected resistance values, mutual interference effects may be cancelled. The system is suitable for measuring phase currents in an installation housed in a cabinet or cubicle.

2 Claims, 2 Drawing Sheets

SYSTEM FOR MEASURING PHASE CURRENTS IN A 3-PHASE INSTALLATION

The present invention relates to a system for measuring phase currents in a three-phase installation, and intended in particular for fitting to medium tension equipment.

The present invention relates more particularly to a measuring system in which the transducer used for converting the current in each phase into a measurement signal is a Rogowski coil.

BACKGROUND OF THE INVENTION

It is recalled that a Rogowski coil is a toroidal coil without a magnetic core and surrounding the conductor in which the current is to be measured. For an article about measuring current using Rogowski coils, reference can be made to IEE Proceedings Sections A to I, volume 130, part B, No. 5, September 1983, pages 360 to 363.

The electromotive force E induced in such a coil is proportional to the derivative with respect to time of the current I, and which may be expressed by the following equation which is valid to a first approximation:

$$E = S \frac{\partial I}{\partial t} \text{ where}$$

$$S = N \mu_0 \frac{\pi}{4} \frac{(D+d)^2}{2\pi R} = \frac{1}{8} N \mu_0 \frac{(D+d)^2}{R}$$

where:
- N = number of turns in the coil
- $\mu_0$ = permeability of free space
- D = the diameter of the coil former
- d = the diameter of the coil wire (including insulation)
- R = distance from the center of the conductor to the center of the toroidal section.

The term S is referred to as the "sensitivity" of the Rogowski coil.

Finally, it is recalled that the equivalent electrical circuit of a Rogowski coil as seen from the load is constituted by an alternating source $E = S \rho I / \rho t$ in series with an inductance l and a resistance r, where:
- l = N.S
- and $r = 4\rho N(D+d)/d_0^2$ where:
- $d_0$ = the diameter of the bare wire, and
- $\rho$ is the resistivity of the wire material.

When the current is measured in each of the phases of a three-phase circuit, a Rogowski coil is placed on each phase wire. However, in industrial applications such as medium tension equipment housed in a common cabinet or cubicle, all three coils may be close together. This means that interference from one phase may appear in another phase, and in particular a large current flowing in one of the phases may induce an emf in the coils for the adjacent phases by magnetic coupling.

An object of the invention is to associate a circuit with the measurement system for eliminating the disturbing effects of mutual coupling.

German patent specification DE-A-2 845 155 describes the problem of eliminating mutual induction between coils, but is does not describe means for solving it.

SUMMARY OF THE INVENTION

The present invention provides a system for measuring phase currents in a three-phase installation, the system including a Rogowski coil on each of the phase conductors (i, j, k), all three Rogowski coils being identical, each coil being connected to an operational amplifier whose output provides a signal proportional to the value of the current in the corresponding phase, said amplifier being mounted as an integrator having a first resistance (R1) connected to its negative input, and a second resistance (R2) and a capacitance (C) connected in parallel between its negative input and its output, and a third resistance (R3) connected between its positive input and the ground, wherein each Rogowski coil is connected to the input of an inverting amplifier with the output of the inverting amplifier associated with any one of the phases (i) being connected to the operational amplifiers corresponding to the other two phases (j, k) via resistances of value rij and rik, with resistance values rij being selected so that mij=0 where the terms mij are the non-diagonal terms of the matrix $[M] = [y].[s]$ where:

$$[s] = \begin{pmatrix} S & m12 & m13 \\ m12 & S & m23 \\ m13 & m23 & S \end{pmatrix}$$

and $$[y] = \begin{pmatrix} \frac{1}{R1} & -\frac{1}{r21} & -\frac{1}{r31} \\ -\frac{1}{r12} & \frac{1}{R1} & -\frac{1}{r32} \\ -\frac{1}{r13} & -\frac{1}{r23} & \frac{1}{R1} \end{pmatrix}$$

with:
- R1 being said value of the first resistance;
- S being the sensitivity of each Rogowski coil with respect to its own phase; and
- mij being the sensitivity of Rogowski coil on phase i with respect to the current flowing in adjacent phase j.

In a variant, the present invention provides a system for measuring phase currents in a three-phase installation, the system including a Rogowski coil disposed on each of three phase conductors (i, j, k), all three Rogowski coils being identical, each coil being connected to an operational amplifier whose output provides a signal proportional to the value of the current in the corresponding phase, said amplifier being connected as an integrator with a first resistance (R1) being connected to its negative input, with a capacitance (C) being connected in parallel between its negative input and its output, and a second resistance (R'2) connected between its positive input and ground, with the output of any one of the coils of phase (i) also being connected to the positive inputs of the operational amplifiers corresponding to the other phases (j, k) via respective resistances rij and rik, with all of the resistances rij having the same value $\rho$ which is much greater than that of said second resistance R'2, and the ratio $R'2/\rho$ being approximately equal to $m/(m+S)$, where:

m is the sensitivity of each Rogowski coil reative to the current flowing in an adjacent phase; and S is the sensitivity of each Rogowski coil relative to the current flowing in its own phase.

BRIEF DESCRIPTION OF THE DRAWINGS

Two embodiments of the invention are described by way of example with reference to the accompanying drawings, in which.

DETAILED DESCRIPTION

Figure 1:
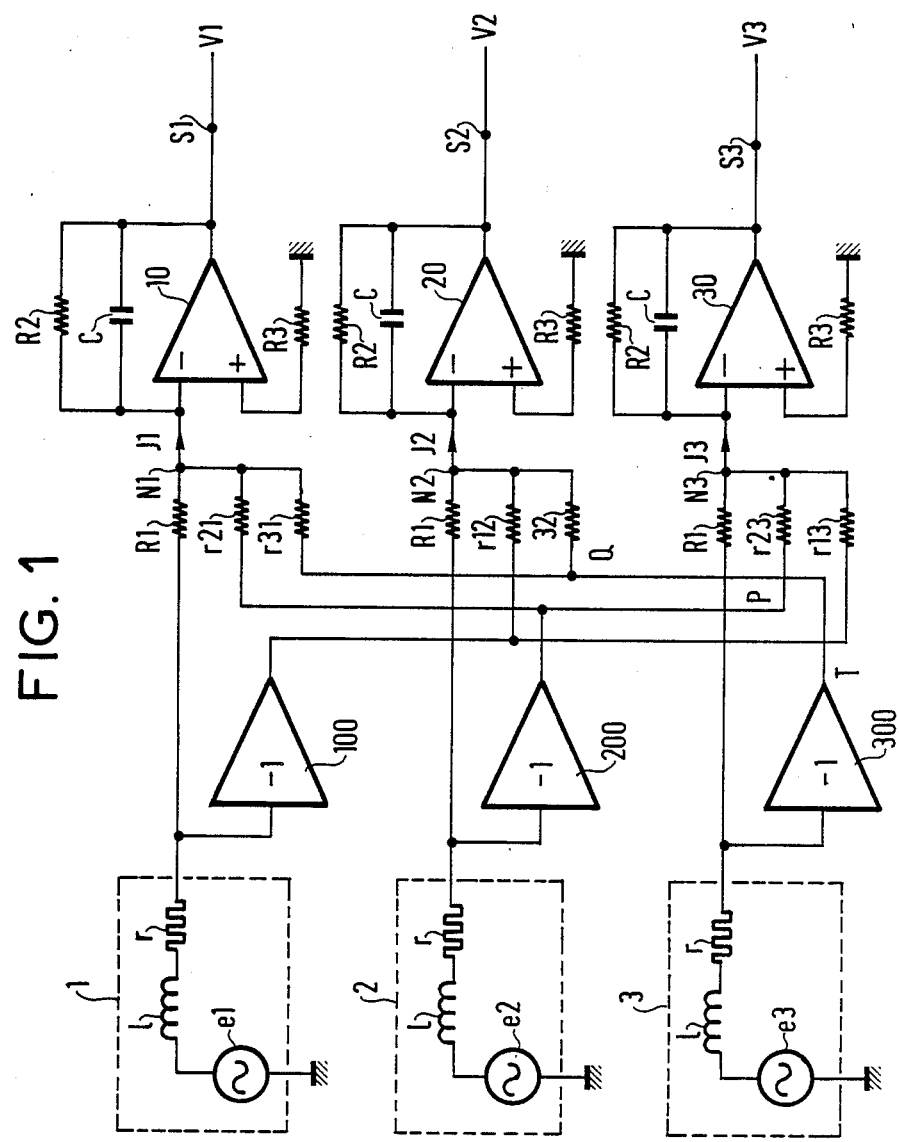
FIG. 1 is the electrical circuit diagram of a first embodiment of a system in accordance with the invention for measuring current and capable of obtaining exact compensation.

In FIG. 1, rectangles referenced 1, 2, and 3 symbolize three identical Rogowski coils which are superposed and which are disposed on respective ones of the phases in a three-phase installation, with the currents to be measured being designated I1, I2, and I3.

Within each rectangle, the coils are represented by their equivalent circuit values e, l, and r, as described above.

Each of the coils is associated with a respective operational amplifier 10, 20, and 30 via a resistance of value R1 connected to the negative input of the amplifier.

Each of the operational amplifiers has a resistance of value R2 and a capacitance of value C connected in parallel therewith.

Finally, the positive input terminal of each operational amplifier is connected to ground via a resistance of value R3.

The output from the coil 1 is connected to an inverting amplifier 100 having high input impedance and a gain equal to −1.

The output from the amplifier 100 is connected via a resistance r12 to the negative input of operational amplifier 20 and via a resistance r13 to the negative input of operational amplifier 30.

Similarly, the output from coil 2 is connected to an inverter 200 whose output is connected to operational amplifier 100 via a resistance r21 and to operational amplifier 30 via a resistance r23.

Finally, the output from coil 3 is connected to an inverter 300 whose output is connected to operational amplifier 10 via a resistance r31 and to operational amplifier 20 via a resistance r32.

The voltages at the output S1, S2, and S3 of the operational amplifiers are respectively designated V1, V2, and V3.

It is shown below that when appropriate values are selected for the various resistances in the circuit, and providing the Rogowski coils are identical, then the mutual induction between the coils is cancelled and the signals V1, V2, and V3 are respectively proportional to the phase currents I1, I2, and I3.

J1, J2, and J3 designate the values of the currents at the nodes N1, N2, and N3 constituted by the groups of three resistances connected to the negative inputs of the operational amplifiers.

The open circuit voltages at the terminals of the Rogowski coils are given by:

$e1 = SpI1 + m12pI2 + m13pI3$ $e2 = m12pI1 + SpI2 + m23pI3$ $e3 = m13pI1 + m23pI2 + SpI3$ where:
S = sensitivity of the Rogowski coils
p = the Laplace operator (differentiating by multiplying by p)
ei = voltages (in complex notation)
Ii = currents (in complex notation)
mij = mji = sensitivity of the coil on phase i to the current flowing on phase j.

The currents J1, J2, and J3 are given by:

$$J1 = \frac{1}{R1} e1 - \frac{1}{r21} e2 - \frac{1}{r31} e3$$

$$J2 = \frac{1}{r12} e1 - \frac{1}{R1} e2 - \frac{1}{r32} e3$$

$$J3 = \frac{1}{r13} e1 - \frac{1}{r23} e2 - \frac{1}{R1} e3$$

It is assumed that the sensors are identical (R1 is identical for all three phases) and that R1 is very large compared with r, thereby making it possible to ignore the voltage drop across the internal impedance of the sensors.

These equations can be written in matrix form:

$$[e] = [s] \cdot [I] \cdot p$$

$$[J] = [y] \cdot [e] = [y] \cdot [s] \cdot [I] \cdot p$$

$$[e] = \begin{pmatrix} e1 \\ e2 \\ e3 \end{pmatrix} [I] = \begin{pmatrix} I1 \\ I2 \\ I3 \end{pmatrix} [J] = \begin{pmatrix} J1 \\ J2 \\ J3 \end{pmatrix}$$

$$[s] = \begin{pmatrix} S & m12 & m13 \\ m12 & S & m23 \\ m13 & m23 & S \end{pmatrix} [y] = \begin{pmatrix} \frac{1}{R1} & -\frac{1}{r21} & -\frac{1}{r31} \\ -\frac{1}{r12} & \frac{1}{R1} & -\frac{1}{r32} \\ -\frac{1}{r13} & -\frac{1}{r23} & \frac{1}{R1} \end{pmatrix}$$

Put $[M] = [y] \cdot [s]$ $$[M] = \begin{pmatrix} M11 & M21 & M31 \\ M12 & M22 & M32 \\ M13 & M23 & M33 \end{pmatrix}$$

where $$M11 = \frac{S}{R1} - \frac{m12}{r21} - \frac{m13}{r31}$$

$$M22 = \frac{S}{R1} - \frac{m12}{r12} - \frac{m23}{r32}$$

$$M33 = \frac{S}{R1} - \frac{m13}{r13} - \frac{m23}{r23}$$

The resistance values r12, r13, r21, r23, and r32 are chosen to ensure that the following is true as nearly as possible: M21=M31=M12=M32=M13=M23=0.

This requires the following system of equations to be solved:

$$M21 = \frac{m12}{R1} - \frac{S}{r21} - \frac{m23}{r31} = 0$$

$$M31 = \frac{m13}{R1} - \frac{m23}{r21} - \frac{S}{r31} = 0$$

-continued $$M12 = \frac{S}{r12} - \frac{m12}{R1} - \frac{m13}{r32} = 0$$

$$M32 = \frac{m13}{r12} - \frac{m23}{R1} - \frac{S}{r32} = 0$$

$$M13 = \frac{S}{r13} - \frac{m12}{r23} - \frac{m13}{R1} = 0$$

$$M23 = \frac{M12}{r13} - \frac{S}{r23} - \frac{m23}{R1} = 0$$

Which leads to the following solutions:

$$r31 = R1 \frac{S^2 - (m23)^2}{S \cdot m13 - m12 \cdot m23}$$

$$r21 = R1 \frac{S^2 - (m23)^2}{S \cdot m12 - m13 \cdot m23}$$

$$r32 = R1 \frac{S^2 - (m13)^2}{S \cdot m23 - m12 \cdot m13}$$

$$r12 = R1 \frac{S^2 - (m13)^2}{S \cdot m12 - m23 \cdot m13}$$

$$r23 = R1 \frac{S^2 - (m12)^2}{S \cdot m23 - m13 \cdot m12}$$

$$r13 = R1 \frac{S^2 - (m12)^2}{S \cdot m13 - m23 \cdot m12}$$

In which case, the values of the currents J1, J2, and J3 are given by:

$$J1 = M11pI1 = \left(\frac{S}{R1} - \frac{m12}{r21} - \frac{m13}{r31}\right)pI1,$$

$$J2 = M22pI2 = \left(\frac{S}{R1} - \frac{m12}{r12} - \frac{m23}{r32}\right)pI2,$$

$$J3 = M33pI3 = \left(\frac{S}{R1} - \frac{m13}{r13} - \frac{m23}{r23}\right)pI3,$$

The induction from adjacent phases is completely eliminated. The output voltages can be obtained (ignoring R2) merely by integrating, since:

$$V1 = \frac{R2}{1 + R2Cp} \cdot J1 = \frac{1}{Cp} \cdot I1 \cdot \frac{R2Cp}{R2Cp + 1}$$

providing $R2Cp \gg 1$, then $V1 \approx J1/Cp$
Whence the equations:

$$V1 = \frac{M11}{C} I1 \cdot H(p)$$

$$V2 = \frac{M22}{C} I2 \cdot H(p)$$

$$V3 = \frac{M33}{C} I2 \cdot H(p)$$

where $H(p) = \frac{R2Cp}{R2CP + 1} \approx 1$ providing $R2Cp \gg 1$.

Interferring coupling is indeed cancelled.

The embodiment described above requires three inverting amplifiers to be used.

A cheaper embodiment is described with reference to FIG. 2. It provides adequate compensation so long as the coupling between adjacent phases and sensors is low.

Figure 2:
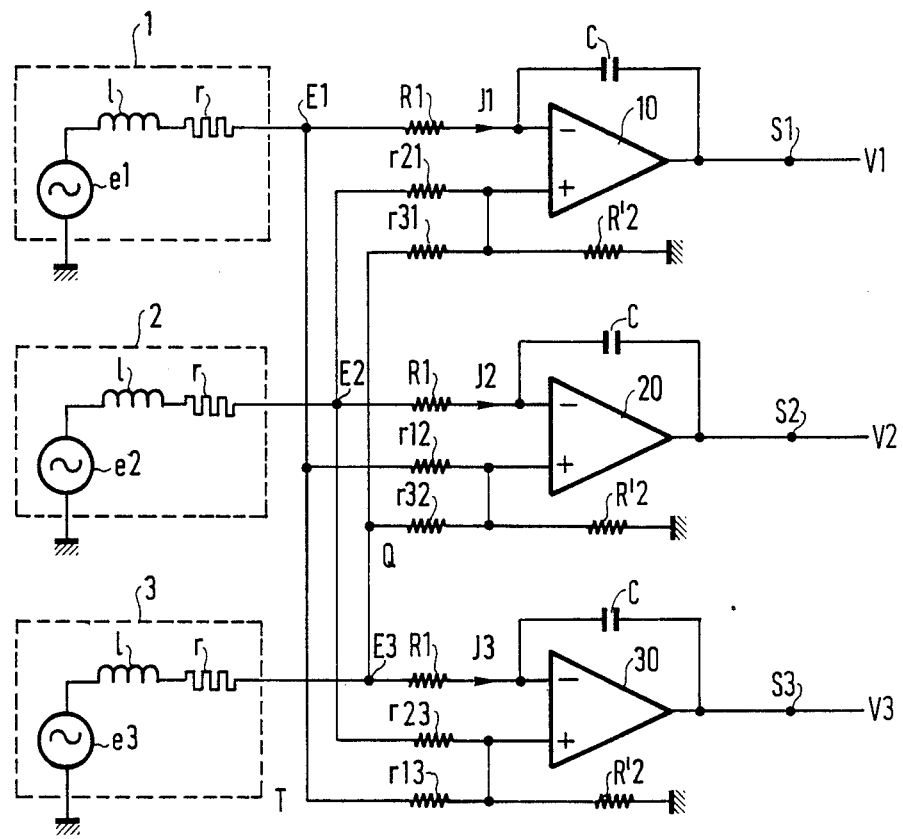
FIG. 2 is a circuit diagram of a cheaper embodiment providing adequate compensation so long as m<<s.

Items which are common both to FIGS. 1 and 2 are given the same reference numerals.

FIG. 2 shows the Rogowski coils 1, 2, and 3, the operational amplifiers 10, 20, and 30, their respective input resistances 1, but in parallel they only have the capacitances C.

The output from coil 1 is connected by a resistance r12 to the positive input of operational amplifier 20 and by a resistance r13 to the positive of operational amplifier 30. Similarly, the output from coil 2 is connected via a resistance r21 to the positive input of operational amplifier 10 and via a resistance r23 to the positive input of operational amplifier 30.

Finally, the output of coil 3 is connected via a resistance r31 to the positive input of operational amplifier 10 and via a resistance r32 to the positive input of operational amplifier 20.

When the phases are symmetrical and the coils are identical:

$$m12 = m13 = m23 = m.$$

It is shown below, with respect to phase 1 only, that the compensation is effective.

The symbol $\rho$ designates the common resistance value of r12, r13, r21, r23, r31, and r32, and the symbols $V+$ and $V-$ designate the input voltages to operational amplifier 10, such that:

$$V+ = \frac{\frac{\rho R'2}{\rho + R'2}}{\frac{\rho R'2}{\rho + R'2} + \rho} (E2 + E3)$$

where E2 and E3 designate the output voltages from the Rogowski coils. By definition the coupling is assumed to be low: (m/s very much less than 1).

If $\rho$ is much greater than $R'2$, then:

$$V+ = \frac{R'2}{\rho} (E2 + E3)$$

whence $$J1 = \frac{E1 - V+}{R1} = Cp(V+ - V1)$$

whence:

$$V1 = -\frac{1}{R1Cp} E1 + \frac{1 + RC1p}{R1Cp} V+$$

$$= -\frac{1}{R1Cp} E1 + \frac{R'2}{\rho} \cdot \frac{(1 + RC1p)}{R1Cp} (E2 + E3)$$

but:
$E1 = SpI1 = mp (I2 + I3)$
$E2 = SpI2 = mp (I1 + I3)$
$E3 = SpI3 = mp (I1 + I2)$
$R1CpV1 = -SPI1 - mp(I2 + I3) +$ $$\frac{R'2}{\rho} (1 + R1Cp)[Sp(I2 + I3) + mp(2I1 + I2 + I3)]$$

$$R1CpV1 = -\left[S - 2m\frac{R'2}{\rho} (1 + R1Cp)\right]I1 +$$

$$\left[\frac{R'2}{\rho} (1 + R1Cp)(S + m) - m\right](I2 + I3)$$

-continued

In practice, $R1Cp = R1C\omega < < 1$
(For example $R1C\omega = 0.01$)
If $p$ is selected such that:

$$\frac{R'2}{\rho}(1 + R1Cp)(S + m) - m = 0$$

I.e., $\frac{R'2}{\rho} \approx \frac{m}{m+s}$ (neglecting $R1Cp$)

Then:

$$V1 = \frac{S}{R1C}\left[1 - 2m\frac{R'2}{\rho}(1 + R1Cp)\right]I1$$

Since $R1Cp$ is small compared with 1, $$V1 = -\frac{S}{R1C}\left[1 - 2m\frac{R'2}{\rho}\right]$$

The induction from adjacent phases is eliminated.

It should not be forgotten that this simplified circuit relies on the following assumptions:

low interferring coupling $m/S << 1$ high integrator gain $R1Cp << 1$.

Although not perfect, the compensation provided by the circuit of FIG. 2 is adequate in many cases, and the circuit is much cheaper than that of FIG. 1.

I claim:

1. A system for measuring phase currents in a three-phase installation, the system including a Rogowski coil on each of the phase conductors (i, j, k), all three Rogowski coils being identical, each coil being connected to an operational amplifier whose output provides a signal proportional to the value of the current in the corresponding phase, said amplifier being mounted as an integrator having a first resistance (R1) connected to its negative input, and a second resistance (R2) and a capacitance (C) connected in parallel between its negative input and its output, and a third resistance (R3) connected between its positive input and the ground, wherein each Rogowski coil (1, 2, 3) is connected to the input of an inverting amplifier (100, 200, 300) with the output of the inverting amplifier (100) associated with any one of the phases (i) being connected to the operational amplifiers (20, 30) corresponding to the other two phases (j, k) via resistances of value rij and rik, with resistance values rij being selected so that mij=0 where the terms mij are the non-diagonal terms of the matrix $[M]=[y].[s]$ where:

$$[s] = \begin{pmatrix} S & m12 & m13 \\ m12 & S & m23 \\ m13 & m23 & S \end{pmatrix}$$

and $$[y] = \begin{pmatrix} \frac{1}{R1} & -\frac{1}{r21} & -\frac{1}{r31} \\ -\frac{1}{r12} & \frac{1}{R1} & -\frac{1}{r32} \\ -\frac{1}{r13} & -\frac{1}{r23} & \frac{1}{R1} \end{pmatrix}$$

with:
R1 being said value of the first resistance;
S being the sensitivity of each Rogowski coil with respect to its own phase; and
mij being the sensitivity of Rogowski coil on phase i with respedct to the current flowing in adjacent phase j.

2. A system for measuring phase currents in a three-phase installation, the system including a Rogowski coil disposed on each of three phase conductors (i, j, k), all three Rogowski coils being identical, each coil being connected to an operational amplifier whose output provides a signal proportional to the value of the current in the corresponding phase, said amplifier being connected as an integrator with a first resistance (R1) being connected to its negative input, with a capacitance (C) being connected in parallel between its negative input and its output, and a second resistance (R'2) connected between its positive input and ground, with the output of any one of the coils of phase (i) also being connected to the positive inputs of the operational amplifiers corresponding to the other phases (j, k) via respective resistances rij and rik, with all of the resistances rij having the same value o which is much greater than that of said second resistance R'2, and the ratio R'2/o being approximately equal to m/(m+S), where:
m is the sensitivity of each Rogowski coil relative to the current flowing in an adjacent phase; and
S is the sensitivity of each Rogowski coil relative to the current flowing in its own phase.

* * * * *